(12) United States Patent
Giovannotto (10) Patent No.: US 7,348,845 B2
(45) Date of Patent: Mar. 25, 2008

(54) SYSTEM AND METHOD FOR EMPLOYING VARIABLE MAGNETIC FLUX BIAS IN AN AMPLIFIER

(76) Inventor: Roberto Michele Giovannotto, P.O. Box 60177, Palo Alto, CA (US) 94306

( * ) Notice: Subject to any disclaimer, the term of this patent is extended or adjusted under 35 U.S.C. 154(b) by 152 days.

(21) Appl. No.: 11/437,316

(22) Filed: May 18, 2006

(65) Prior Publication Data

US 2006/0261889 A1    Nov. 23, 2006

Related U.S. Application Data

(60) Provisional application No. 60/683,549, filed on May 19, 2005.

(51) Int. Cl.
*H03F 1/00* (2006.01)
(52) U.S. Cl. .................. 330/195; 330/165; 330/171; 330/190
(58) Field of Classification Search ............... 330/195, 330/165, 171, 190
See application file for complete search history.

(56) References Cited

U.S. PATENT DOCUMENTS

| | | | |
|---|---|---|---|
| 1,448,550 A | | 3/1923 | Arnold et al. |
| 4,075,671 A | * | 2/1978 | Cheatham et al. ............ 360/66 |
| 5,422,599 A | * | 6/1995 | Larsen ....................... 330/196 |
| 5,438,499 A | * | 8/1995 | Bonte et al. .............. 363/21.16 |
| 6,400,580 B1 | * | 6/2002 | Bowman et al. .............. 363/17 |
| 6,958,920 B2 | * | 10/2005 | Mednik et al. ............... 363/19 |
| 7,130,204 B2 | * | 10/2006 | Tsuruya .................... 363/56.12 |

OTHER PUBLICATIONS

Gilbert, Joe et al., "Linear Hall-Effect Sensors", Applications Information, date unknown, 2002, pp. 1-12, Allegro MicroSystems, Inc., Worcester, U.S.A.
Langford-Smith, F.,"Radiotron Designer's Handbook," 1953, 4th Edition, pp. 214-215, Wireless Press, Sydney, Australia.

* cited by examiner

Primary Examiner—Patricia Nguyen
(74) Attorney, Agent, or Firm—Carr & Ferrell LLP (57) ABSTRACT

A system and method for employing variable magnetic flux bias in an amplifier. The amplifier system comprises an output transformer and a magnetic sensor configured to sense a first magnetic flux of the output transformer. The magnetic sensor generates a flux signal responsive to the first magnetic flux. Control circuitry is configured to receive the flux signal and to generate a control signal responsive to the flux signal. A winding is configured to receive the control signal and to induce a second magnetic flux within the output transformer responsive to the control signal, the second magnetic flux having opposite polarity to the first magnetic flux. The second magnetic flux may maintain a non-zero quiescent magnetic bias level within the output transformer, or may substantially cancel or null the DC and low-frequency subsonic components of the first magnetic flux.

21 Claims, 6 Drawing Sheets

SYSTEM AND METHOD FOR EMPLOYING VARIABLE MAGNETIC FLUX BIAS IN AN AMPLIFIER

CROSS-REFERENCE TO RELATED APPLICATIONS

This application claims the benefit of U.S. Provisional Application Ser. No. 60/683,549 titled "Audio Frequency Amplifier Employing Variable Magnetic Flux Bias," filed May 19, 2005, which is hereby incorporated by reference.

BACKGROUND OF THE INVENTION

1. Field of the Invention

The present invention relates generally to amplifiers, and more particularly to a system and method of employing variable magnetic flux bias in an amplifier.

2. Description of the Related Art

The output power and distortion of an audio frequency amplifier using an output transformer is partially dependent on the specific magnetic properties of the output transformer. Output transformers are commonly used with vacuum tube amplifiers. Such output transformers are used to match the higher impedance of the vacuum tubes to the typically lower impedance of the loudspeakers. Output transformers may also be used for isolation of the amplifier from the load. In these amplifiers, the output transformer may saturate (i.e., saturation of the core) due to the direct current (DC) and low-frequency subsonic currents flowing in the primary of the output transformer. Thus, amplifier designs using an output transformer may suffer from a lack of fidelity and loss of power at the lower-frequency end of the audio spectrum.

The desired signals, those being amplified, are responsible for an alternating magnetic flux component within the output transformer. This alternating magnetic flux follows a magnetic path centered at the quiescent magnetic bias level. The quiescent magnetic bias level is due to the DC and low-frequency subsonic current flowing in the output transformer's primary winding. If the quiescent magnetic bias level is not close to a zero level, the alternating magnetic flux swing within the output transformer's core may cause magnetic saturation. Saturation of the output transformer is undesirable because a greater magnetic flux swing is needed within the output transformer to maintain output power and minimize total harmonic distortion at lower signal frequencies.

One prior art technique addresses the problem of magnetic saturation of the output transformer in an amplifier by placing a physical gap within the output transformer's core. The physical gap significantly lengthens the magnetic path, increasing the magnetic reluctance and shearing the magnetic loop, and thus decreasing the quiescent magnetic flux level. However, this technique reduces the relative magnetic permeability of the transformer's core and adversely affects inductance and the low-frequency response of the output transformer.

A second prior art technique disclosed by Arnold [U.S. Pat. No. 1,448,550] uses a shunt feed capacitor to block DC from passing through the output transformer's primary winding. However, the shunt feed technique suffers from the requirement for a physically large and expensive DC blocking capacitor. The use of smaller shunt feed capacitors adversely effects low-frequency amplifier response to such a degree that shunt feed amplifier systems in the audio market perform only marginally better than amplifier systems employing a physical gap.

A third prior art technique disclosed by Larson [U.S. Pat. No. 5,422,599] uses a current sensing resistor. The current sensing resistor is used to measure the DC and low-frequency current flow in a first primary winding, and to produce in a second primary winding a magnetomotive force equal but opposite to the magnetomotive force in the first primary winding. In this technique, the voltage drop across the current sensing resistor is coupled to a voltage-controlled current source. The voltage-controlled current source couples to the second primary winding and causes opposite DC and low-frequency currents to flow in the second primary. The second primary winding thus may partially cancel the DC and low-frequency magnetomotive force produced by the first primary winding.

However, this technique using a current sensing resistor suffers from several problems, including increased distortion due to the placement of the current sensing resistor in the plate or cathode circuit of the amplifier. In addition, knowledge of the winding ratio between the first primary winding and the second primary winding is required to scale the voltage-controlled current source so as to cancel the DC and low-frequency magnetomotive force produced by the first primary. In practical applications, asymmetries in output transformer windings due to manufacturing tolerances may result in only partial cancellation of the DC and low-frequency magnetomotive force produced by the first primary winding. Finally, this technique does not correct for remnant induction in the output transformer.

Therefore, what is needed are improved techniques that prevent saturation of the output transformer in an amplifier and/or that maintain fidelity and output power at the lower-frequency end of the audio spectrum.

SUMMARY OF THE INVENTION

A system and method are provided for employing variable magnetic flux bias in an amplifier. The amplifier system comprises an output transformer and a magnetic sensor configured to sense a first magnetic flux of the output transformer. The magnetic sensor generates a flux signal responsive to the first magnetic flux. Control circuitry is configured to receive the flux signal and to generate a control signal responsive to the flux signal. One or more windings are configured to receive the control signal and to induce a second magnetic flux within the output transformer responsive to the control signal, the second magnetic flux having opposite polarity to the first magnetic flux. The magnetic sensor may comprise a Hall-Effect sensor, and may further comprise a magnetic flux concentrator. The magnetic sensor may also further comprise a bucking coil.

The control circuitry may be adjusted such that a quiescent magnetic bias level is maintained within the output transformer. In this embodiment, the selected quiescent magnetic bias level produces desired audio effects as, for example, harmonically pleasing sounds. In this embodiment, the amplifier system may be employed as a musical instrument amplifier, such as a guitar amplifier. In another embodiment, the control circuitry may be adjusted so that a magnetic saturation within the output transformer is minimized, and the amplifier system may be employed as a high-fidelity amplifier system.

Various embodiments include a method comprising sensing a first magnetic flux of an output transformer, generating a control signal responsive to the flux signal using control circuitry, and inducing a second magnetic flux within the output transformer responsive to the control signal, the second magnetic flux having opposite polarity to the first magnetic flux.

Various embodiments include a method comprising adjusting the control circuitry so that a quiescent magnetic bias level is maintained within the output transformer, the quiescent magnetic bias level producing desired audio effects as, for example, harmonically pleasing sounds suitable for guitar amplifiers. Other embodiments include a method comprising adjusting the control circuitry so that a magnetic saturation within the output transformer is minimized. This method may be suitable for high-fidelity amplifiers.

BRIEF DESCRIPTION OF THE DRAWINGS

For a more complete understanding of the present invention and for further features and advantages, reference is made to the following description taken in conjunction with the accompanying drawings, in which.

DETAILED DESCRIPTION OF THE INVENTION

The embodiments discussed herein are illustrative examples of the present invention. As these embodiments of the present invention are described with reference to illustrations, various modifications or adaptations of the methods and/or specific structures described may become apparent to those skilled in the art. All such modifications, adaptations, or variations that rely upon the teachings of the present invention, and through which these teachings have advanced the art, are considered to be within the scope of the present invention. Hence, these descriptions and drawings should not be considered in a limiting sense, as it is understood that the present invention is in no way limited to only the embodiments illustrated.

A magnetic sensor is placed in proximity to an output transformer of an amplifier to sense the leakage magnetic flux emanating from the output transformer. The leakage magnetic flux is proportional to the total magnetic flux within the output transformer, and the magnetic sensor generates a flux signal representing this total magnetic flux. The flux signal is further processed to generate a control signal representing the DC and low-frequency subsonic components of the total magnetic flux. One or more windings of the output transformer receives this control signal and induces an opposite polarity magnetic flux that may partially or substantially cancel or null the DC and low-frequency components of the total magnetic flux within the output transformer. As the result, the quiescent magnetic bias level of the output transformer may be adjusted, and/or the saturation of the output transformer may be minimized.

Figure 1:
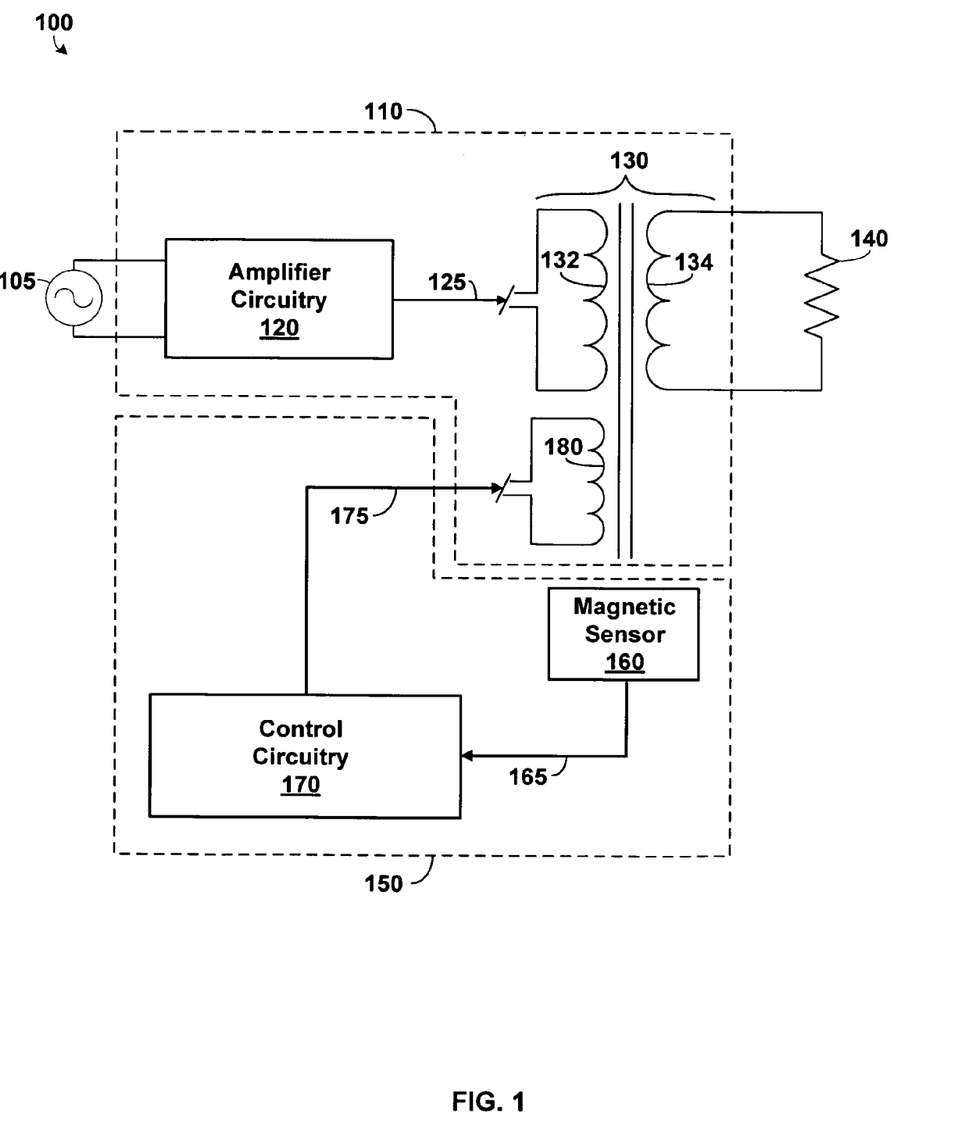
FIG. 1 is a block diagram of an amplifier system in an exemplary embodiment.

FIG. 1 is a block diagram of amplifier system 100 in an exemplary embodiment. Amplifier system 100 comprises amplifier 110 and variable magnetic flux bias system 150. Amplifier 110 comprises amplifier circuitry 120, amplifier signal line 125, output transformer 130, primary winding 132, secondary winding 134, control winding 180, and optionally load 140. Amplifier 110 receives input signals from signal source 105, and provides amplified output signals to load 140. Variable magnetic flux bias system 150 comprises magnetic sensor 160, flux signal line 165, control circuitry 170, and control signal line 175.

Amplifier circuitry 120 may be any audio amplifier known in the prior art that uses an output transformer, such as output transformer 130, and may comprise vacuum tubes in a triode, tetrode, or pentode configuration, or may comprise solid state devices. Amplifier circuitry 120 may be operated in bias modes including, but not limited to, Class A, Class AB(1), Class AB(2), or Class C.

Variable magnetic flux bias system 150 uses magnetic sensor 160 to sense a first magnetic flux in the proximity of output transformer 130. The first magnetic flux is a portion of the leakage magnetic flux emanating from output transformer 130. Magnetic sensor 160 may be a linear-output Hall-Effect sensor. In other embodiments, magnetic sensor 160 may include, but is not limited to, other Hall-Effect sensors, a magnetoresistive sensor, a fluxgate sensor, a superconducting quantum interference device (SQUID) sensor, or an electron-spin sensor.

By placing magnetic sensor 160 in proximity to output transformer 130, the first magnetic flux of output transformer 130 may be sensed, generating a flux signal on flux signal line 165. The first magnetic flux has components representing a portion of the total magnetic flux within the transformer, comprising both the desired higher-frequency amplifier signal from signal source 105 and the undesired DC and low-frequency subsonic components.

Flux signal line 165 is coupled to control circuitry 170. Control circuitry 170 is configured to receive the flux signal from flux signal line 165 and to generate a control signal on control signal line 175 representing the undesired DC and low-frequency subsonic components of the first magnetic flux of output transformer 130.

Control winding 180 is coupled to control circuitry 170 via control signal line 175, and thereby receives the control signal. Using the received control signal, control winding 180 induces a second magnetic flux in output transformer 130 that may set a non-zero quiescent magnetic bias level in output transformer 130. Alternatively, control circuitry 170 may generate a control signal that causes control winding 180 to induce a second magnetic flux that substantially cancels out or nulls the undesired DC and low-frequency subsonic components of the first magnetic flux in output transformer 130. Control winding 180 may be a spare or unused winding in output transformer 130, or may be added after output transformer 130 is manufactured. Control winding 180 may be a primary winding or a secondary winding of output transformer 130. Control winding 180 may be multiple individual windings coupled to control signal line 175.

In one embodiment, control circuitry 170 may be adjusted so that a quiescent magnetic bias level is maintained within output transformer 130. The quiescent magnetic bias level may be maintained at a level different from zero. This adjustment may use one or more preset configurations. This embodiment may produce desired audio effects as, for example, harmonically pleasing sounds. In this embodiment, amplifier system 100 may be employed as a musical instrument amplifier, such as a guitar amplifier.

In another embodiment, control circuitry 170 may be adjusted so that the second magnetic flux substantially cancels or nulls out the DC and low-frequency subsonic components of the first magnetic flux, and thus minimizes the magnetic saturation within output transformer 130. This adjustment may use one or more preset configurations. In this embodiment, amplifier system 100 may be employed as a high-fidelity amplifier system.

Control circuitry 170 may be implemented using operational amplifiers, or alternatively using a proportional integral (PI) or proportional-integral-derivative (PID) control loop comprising a digital signal processor or microcontroller.

Figure 2:
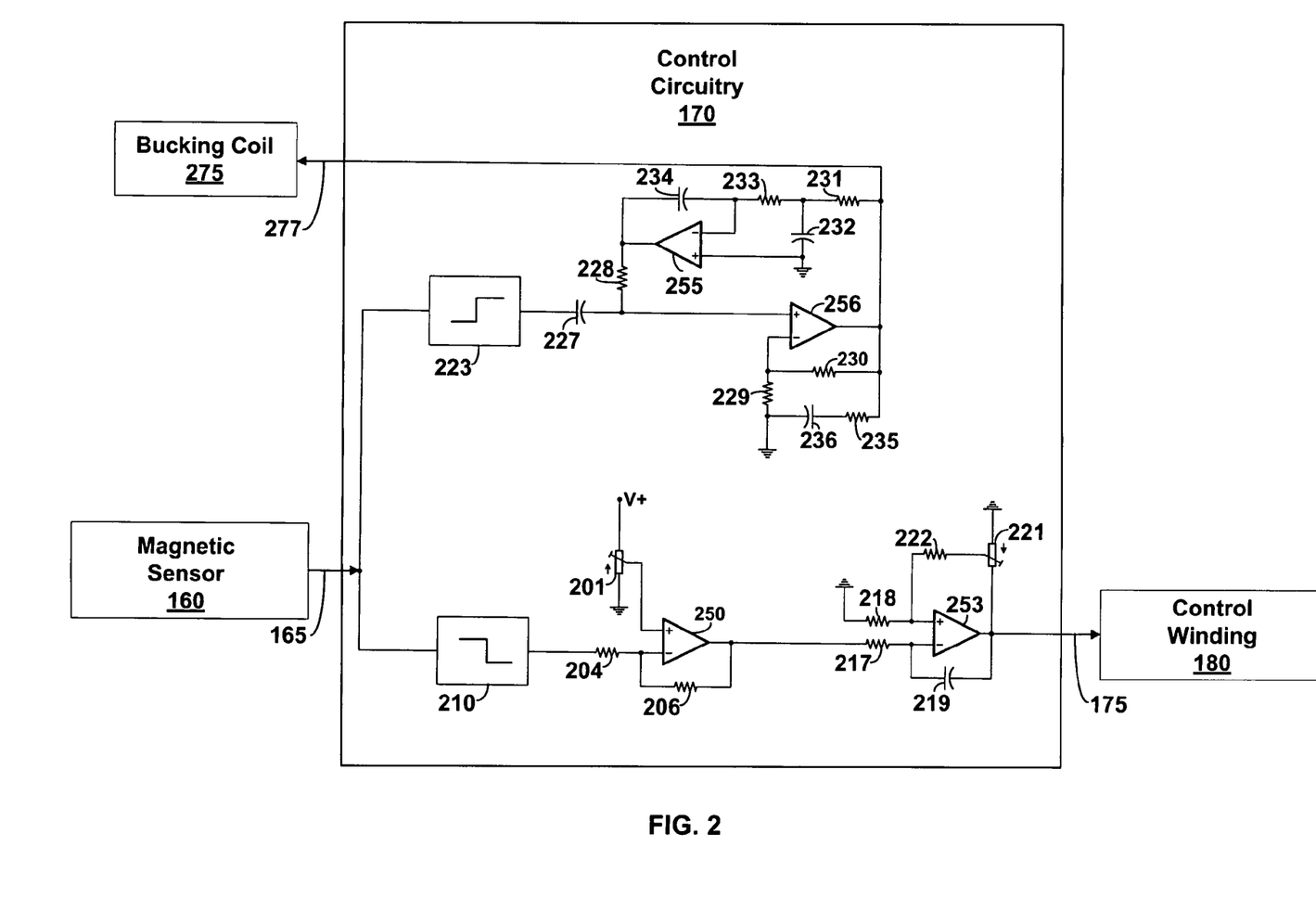
FIG. 2 is a circuit diagram of the control circuitry in an exemplary embodiment.

FIG. 2 is a circuit diagram of control circuitry 170 in an exemplary embodiment implemented using operational amplifiers. Control circuitry 170 comprises low-pass filter 210, operational amplifiers 250 and 253, potentiometers 201 and 221, and resistors 204, 206, 217, 218, 222, and capacitor 219. In various embodiments, control circuitry 170 optionally comprises high-pass filter 223, operational amplifiers 255 and 256, resistors 228, 229, 230, 231, 233, 235, and capacitors 227, 232, 234, and 236, bucking coil 275, and bucking coil coupling line 277. Control circuitry 170 couples to magnetic sensor 160, control winding 180, and optionally to bucking coil 275.

Low-pass filter 210 is selected to have a low-pass cut-off at or lower than the minimum desired reproducible frequency of amplifier system 100. In various embodiments, low-pass filter 210 may have a low-pass cut off at approximately 20 Hertz (Hz). Operational amplifier 250 and resistor 204 and 206 form an inverting amplifier. Potentiometer 201 forms a voltage reference. Operational amplifier 250 thus forms an intermediate stage for generating the control signal output on control signal line 175, and thus the quiescent magnetic bias level within output transformer 130. The output of operational amplifier 250 is integrated with the signal voltage present at the non-inverting terminal of operational amplifier 253. Integration time is determined by resistor 217 and capacitor 219. Potentiometer 221 and resistors 222 and 218 form a compensation network. This compensation network generates a variable voltage offset in the integrator stage.

Potentiometer 221 may be adjusted to calibrate magnetic sensor 160 during an initial system calibration, and may optionally be replaced by a fixed resistor. This calibration may be used to reduce any unwanted effects from stray magnetic fields that may be detected by magnetic sensor 160, and to reduce errors that may be due to a magnetic coupling between output transformer 130 and magnetic sensor 160. Stray magnetic fields detected by magnetic sensor 160 may be due to the earth's magnetic field, for example, or other magnetic fields such as nearby loudspeakers. Note that calibration using potentiometer 221 does not require knowledge of the winding ratio between primary winding 132 and control winding 180 in output transformer 130.

In one example of a calibration procedure for amplifier system 100, amplifier circuitry 120 may be operated in single-ended mode with a maximum signal output at the lowest desired operating frequency. Potentiometer 201 is first adjusted to zero the control signal on control signal line 175 with a demagnetized output transformer 130 under zero induction, and with resistor 218 temporarily shunted to ground and capacitor 219 temporarily shorted across its terminals. Next, resistor 228 and capacitor 219 are returned to their operating configuration and potentiometer 221 is adjusted for the lowest possible distortion in secondary winding 134 under load 140. Potentiometer 221 may optionally be replaced by a fixed resistor.

Potentiometer 201 may be adjusted to minimize the magnetic saturation in output transformer 130. Potentiometer 201 may also be adjusted so that a quiescent magnetic bias level is maintained in output transformer 130.

In various embodiments, the low-frequency dynamic range of magnetic sensor 160 may be expanded by suppressing the alternating magnetic flux due to signal source 105 and sensed by magnetic sensor 160. This alternating magnetic flux is a component of the first magnetic flux sensed by magnetic sensor 160. Bucking coil 275 may be optionally used to suppress this alternating magnetic flux. Bucking coil 275 is placed in proximity to magnetic sensor 160 as further described with reference to FIG. 4. High-pass filter 223 is selected with a pass band beginning at a frequency near the minimum desired audible pass frequency for amplifier system 100. In various embodiments, high-pass filter 223 may pass frequencies greater than approximately 20 Hz. Signal capacitor 227 provides DC isolation for operational amplifier 256 which is configured as a low-frequency and DC error amplifier. Gain for operational amplifier 256 is determined by resistors 229 and 230, and adjusted based on the sensitivity and linearity of the specific magnetic sensor 160 used in variable magnetic flux bias system 150, as well as on the strength and orientation of the first magnetic flux emanating from output transformer 130.

In one example of a calibration procedure for optional bucking coil 275, a calibration signal may be applied to output transformer 130. The calibration signal may have a frequency approximately equal to the lowest frequency passed by high-pass filter 223, and an amplitude approximately equal to the maximum signal on amplifier signal line 125. Flux signal 175 is then measured and the gain of operational amplifier 256 is selected such that magnetic sensor 160 maintains an output peak-to-peak voltage within its dynamic range. A Zobel network consisting of resistor 235 and capacitor 236 helps to stabilize operation of operational amplifier 256. A low-pass filter comprised of resistor 231 and capacitor 232 provides a pass band below 1 Hz. Thus, operational amplifier 256 maintains a low DC offset voltage at bucking coil 275. Integration time of operational amplifier 255 is determined by capacitor 234 and resistor 233, and resistor 228 provides signal isolation.

Figure 3A:
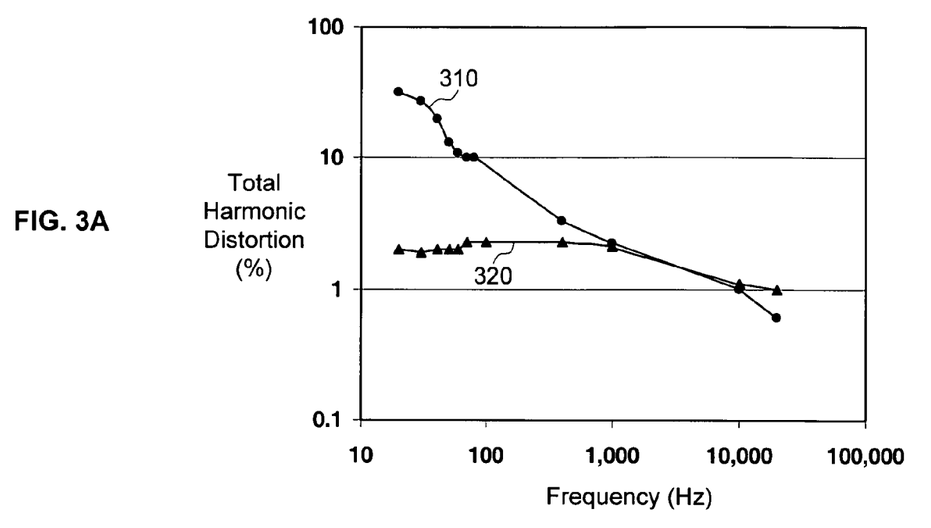
FIG. 3A is a graph of test results depicting Total Harmonic Distortion versus Frequency in an exemplary embodiment.
Figure 3B:
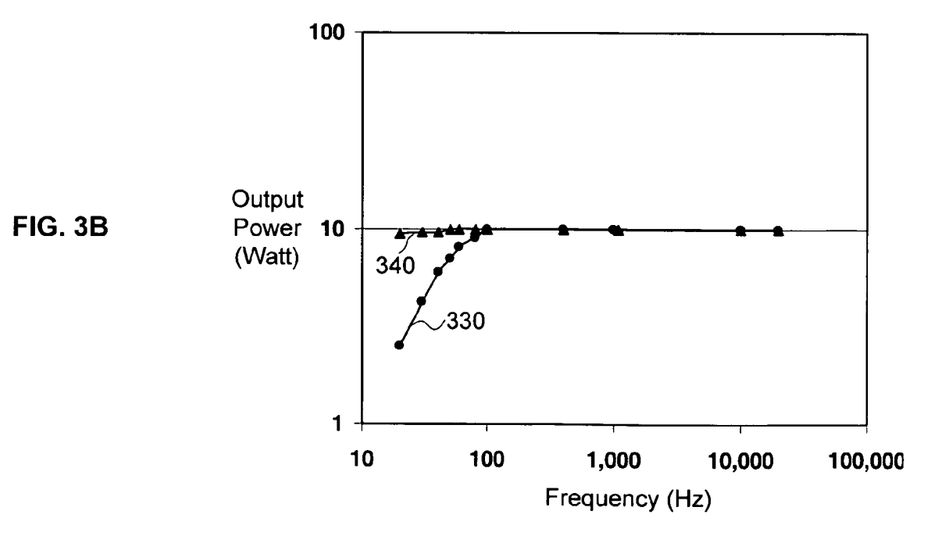
FIG. 3B is a graph of test results depicting Output Power versus Frequency in an exemplary embodiment.

FIGS. 3A and 3B are graphs of test results in an exemplary embodiment depicting total harmonic distortion versus frequency and output power versus frequency, respectively, from approximately 20 Hz to 20,000 Hz. In these examples, amplifier system 100 comprises amplifier circuitry 120 operating in Class A, single-ended mode, with a nominal 10-watt output power. Output transformer 130 is configured as an ungapped transformer with a spare and unused winding configured as control winding 180.

FIG. 3A shows total harmonic distortion versus frequency. Curve 310 represents a configuration of amplifier system 100 without variable magnetic flux bias system 150. In this configuration, control circuitry 170 is disabled and amplifier system 100 is representative of amplifiers in the prior art. In this example, curve 310 demonstrates that total harmonic distortion at 20 Hz is approximately 30%, and that total harmonic distortion does not fall below 2% until the frequency reaches approximately 10,000 Hz.

Curve 320 shown in FIG. 3A represents a configuration of amplifier system 100 using variable magnetic flux bias system 150. In this configuration, magnetic sensor 160 is employed with control circuitry 170, and control signal line 175 delivers the control signal to control winding 180. In this example, curve 320 demonstrates that amplifier system 100 maintains total harmonic distortion at approximately 2% or less from 20 Hz to 20,000 Hz. Thus, variable magnetic flux bias system 150 provides amplifier system 100 with significantly better total harmonic distortion performance at frequencies below approximately 10,000 Hz than do amplifiers in the prior art. Note that above 10,000 Hz, the total harmonic distortion of amplifier system 100 is not significantly increased over amplifiers in the prior art. The small increase in total harmonic distortion above 10,000 Hz shown by curve 320 in FIG. 3A, as compared with curve 310, is due to the additional leakage inductance and winding capacitance of control winding 180, and may be reduced or eliminated in various embodiments of control winding 180.

FIG. 3B shows output power versus frequency. Curve 330 represents a configuration of amplifier system 100 without variable magnetic flux bias system 150. In this configuration control circuitry 170 is disabled and amplifier system 100 is representative of amplifiers in the prior art. In this example, curve 330 demonstrates that output power falls significantly to approximately 2.5 watts at 20 Hz, and does not reach 10 watts until the frequency reaches approximately 100 Hz.

Curve 340 shown in FIG. 3B represents a configuration of amplifier system 100 using variable magnetic flux bias system 150. In this configuration, magnetic sensor 160 is employed with control circuitry 170 and control signal line 175 is delivered to control winding 180. In this example, Curve 340 demonstrates that amplifier system 100 maintains output power at approximately 10 watts from 20 Hz to 20,000 Hz. Thus, variable magnetic flux bias system 150 provides amplifier system 100 with stable output power from 20 Hz to 20,000 Hz and provides significantly better output power performance at frequencies below approximately 100 Hz than do amplifiers in the prior art.

Figure 4:
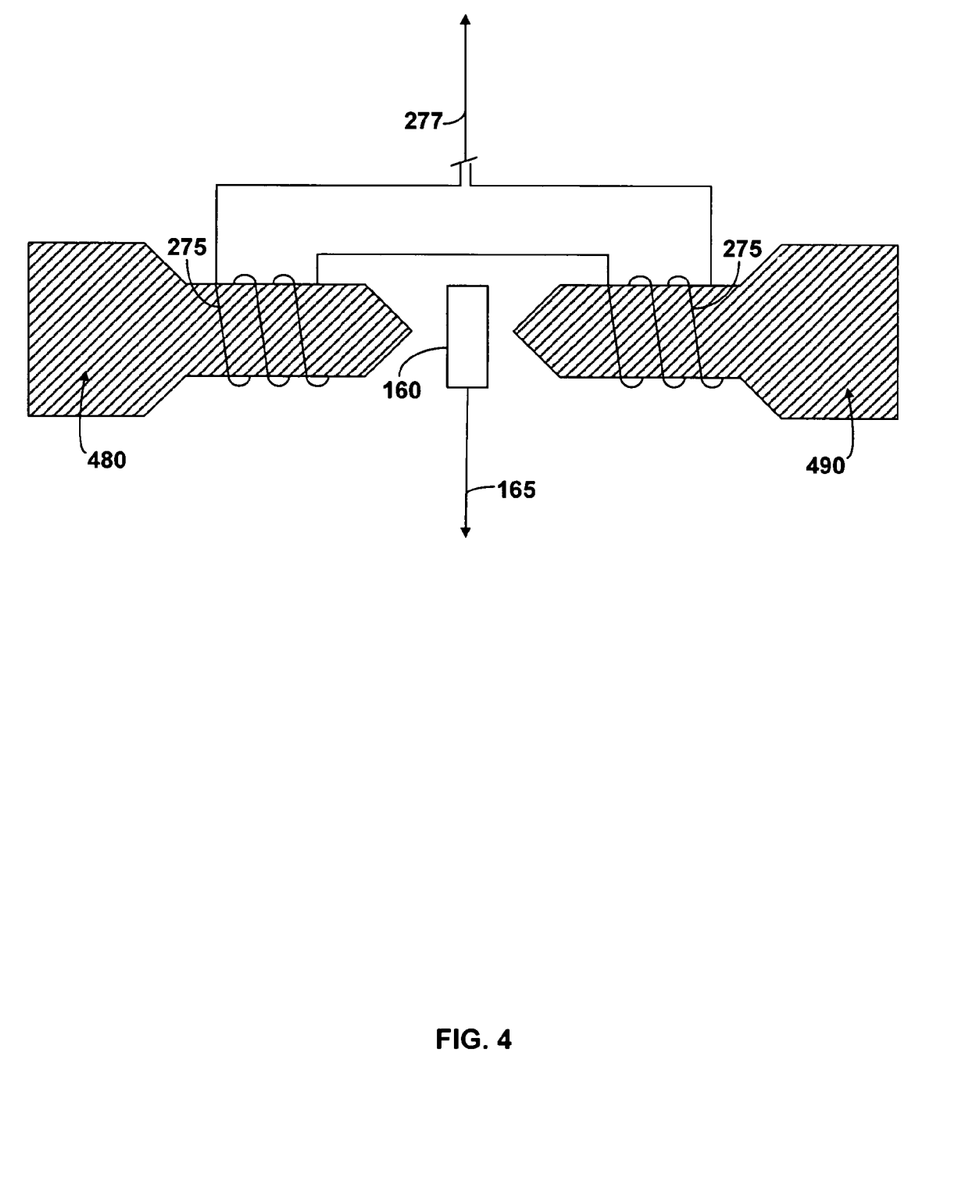
FIG. 4 is an illustration of a magnetic sensor comprising optional flux concentrators and an optional bucking coil in an exemplary embodiment.

FIG. 4 is an illustration of a magnetic sensor comprising optional flux concentrators and an optional bucking coil in an exemplary embodiment. FIG. 4 depicts magnetic sensor 160, flux signal line 165, bucking coil 275, bucking coil coupling line 277, and flux concentrators 480 and 490.

Flux concentrators 480 and 490 may be located near output transformer 130 to couple to the first magnetic flux emanating from output transformer 130. The first magnetic flux emanating from output transformer 130 has components representing a portion of the total magnetic flux within the transformer, comprising both the higher-frequency amplifier signal from signal source 105 and the DC and low-frequency subsonic components. In various embodiments, flux concentrators 480 and 490 may be used to increase the magnetic flux in the region of magnetic sensor 160. When flux concentrators are used, magnetic sensor 160 is generally located between flux concentrators 480 and 490.

A stronger magnetic flux is produced in the region of magnetic sensor 160 if flux concentrators 480 and 490 comprise a soft magnetic metal with high permeability, low remanence, and low coercivity. The shape of flux concentrators 480 and 490 is not essential, so long as flux concentrators 480 and 490 act to increase the magnetic flux sensed by magnetic sensor 160. Flux concentrators 480 and 490 are optionally used when magnetic sensor 160 has a low magnetic flux sensitivity.

In optional embodiments, bucking coil 275 may be used to reduce the undesired alternating magnetic flux sensed by magnetic sensor 160. The first magnetic flux sensed by magnetic sensor 160 is representative of both the higher-frequency amplifier signal from signal source 105 and the DC and low-frequency subsonic components. The undesired alternating magnetic flux is due to the higher-frequency amplifier signal from signal source 105, and this alternating magnetic flux may exceed the dynamic range of magnetic sensor 160. Various embodiments of magnetic sensor 160, such as linear Hall-Effect sensors, have a limited dynamic range before saturation and loss of linearity. Bucking coil 275 may be used to induce an opposite polarity magnetic flux in the region of magnetic sensor 160 to substantially cancel or null the alternating the magnetic flux. Bucking coil 275 is wound on flux concentrators 480 and 490 and is coupled to control circuitry 170 through bucking coil coupling line 277.

Figure 5A:
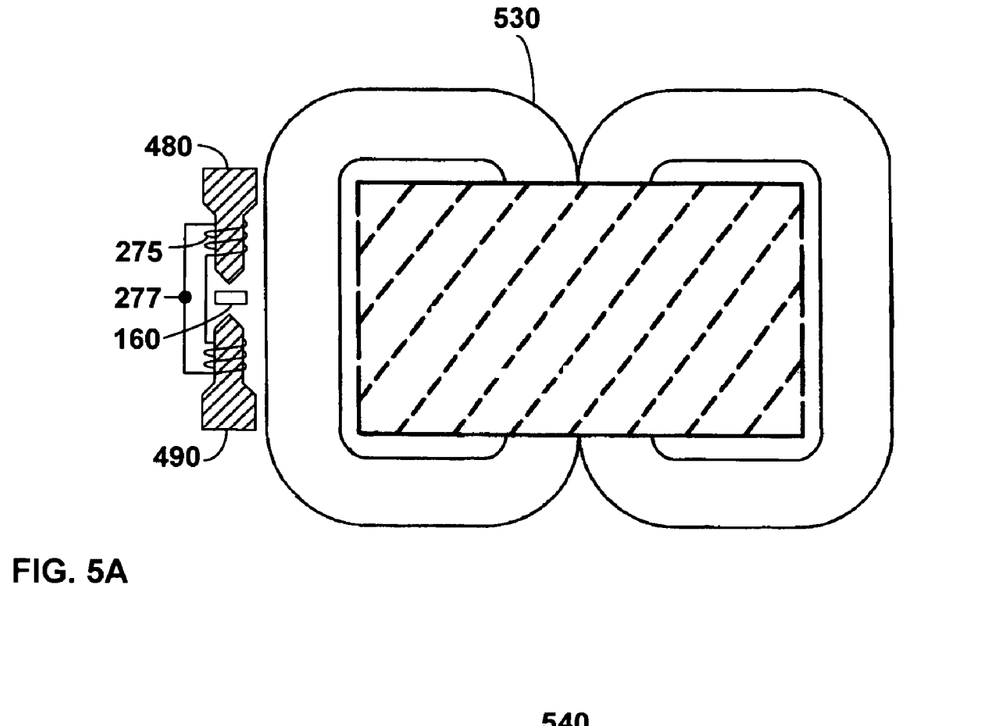
FIG. 5A is a top view illustration of a configuration of the magnetic sensor and a C-type output transformer in an exemplary embodiment.

FIG. 5A is a top view illustration of a configuration of the magnetic sensor and a C-type output transformer in an exemplary embodiment. FIG. 5A depicts output transformer 530, magnetic sensor 160, bucking coil 275, bucking coil coupling line 277, and flux concentrators 480 and 490. In various embodiments, output transformer 530 may comprise E/I-type, shell-type, toroid-type, or C-type output transformers. FIG. 5A depicts output transformer 530 in a C-type configuration commonly employed in audio amplifiers.

In various embodiments, magnetic sensor 160, flux concentrators 480 and 490, and bucking coil 275 may be located adjacent to output transformer 530, as shown, or in other locations in the proximity of output transformer 530. The precise location of magnetic sensor 160 is not critical so long as magnetic sensor 160 may sense the first magnetic flux emanating from output transformer 530. The first magnetic flux emanating from output transformer 530 has components representing a portion of the total magnetic flux within the transformer, comprising both the higher-frequency amplifier signal from signal source 105 and the DC and low-frequency subsonic components.

In other embodiments, magnetic sensor 160 may be located within the core of an output transformer such as output transformer 530. One advantage of locating magnetic sensor 160 within the core of an output transformer is that magnetic sensor 160 is effectively shielded from sources of external magnetic flux, such as the earth's magnetic field.

Figure 5B:
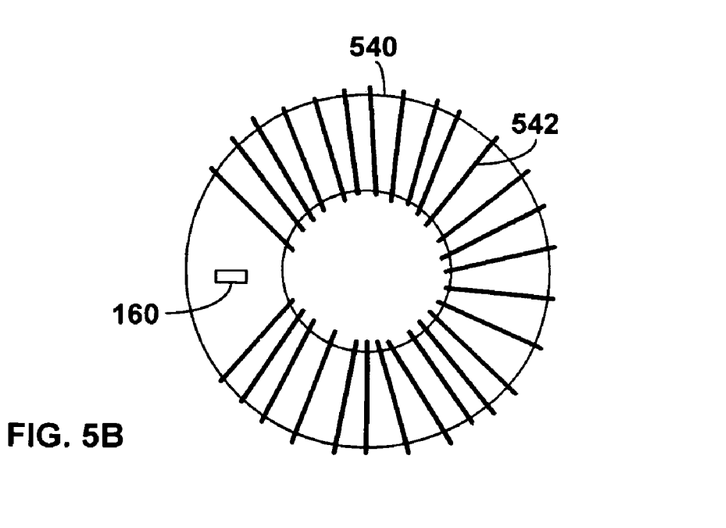
FIG. 5B is a top view illustration of a configuration of the magnetic sensor and a toroid-type output transformer in an exemplary embodiment.

FIG. 5B is a top view illustration of a configuration of magnetic sensor 160 and a toroid-type output transformer in an exemplary embodiment. FIG. 5B depicts toroid-type output transformer 540, windings 542, and magnetic sensor 160. Magnetic sensor 160 is configured to sense the first magnetic flux from a position within the toroid core using a small hole created within the core of toroid-type output transformer 540. In other embodiments, magnetic sensor 160 may be located outside the core of output transformer 540 in a position such that magnetic sensor 160 may sense the first magnetic flux emanating from output transformer 540.

Figure 6:
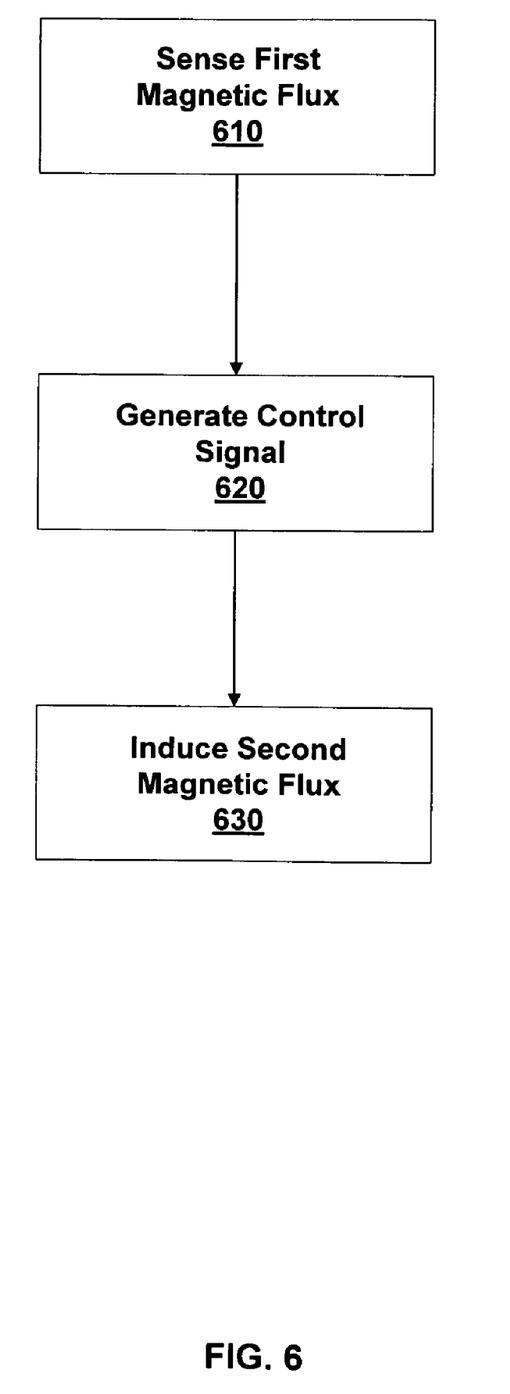
FIG. 6 is an illustration of methods of operating an amplifier system with a magnetic sensor and control circuitry in an exemplary embodiment.

FIG. 6 is an illustration of methods of operating an amplifier system with a magnetic sensor and control circuitry in an exemplary embodiment. In Sense First Magnetic Flux step 610, magnetic sensor 160 senses the first magnetic flux emanating from output transformer 130. The first magnetic flux has components representing a portion of the total magnetic flux within output transformer 130 due to both the higher-frequency amplifier signal from signal source 105 and the DC and low-frequency subsonic components.

The magnetic sensor 160 generates a flux signal that is received by control circuitry 170 from magnetic flux line 165. This flux signal may be proportional to the total magnetic flux in output transformer 130. In optional embodiments, magnetic sensor 160 may be configured with flux concentrators 480 and 490 described herein, to increase the magnetic flux sensed by magnetic sensor 160. In optional embodiments, the low-frequency dynamic range of magnetic sensor 160 may also be expanded by suppressing the alternating magnetic flux due to signal source 105 and sensed by magnetic sensor 160, as previously described with reference to FIG. 4. Bucking coil 275 may be optionally used to suppress this alternating magnetic flux.

In Generate Control Signal step 620, control circuitry 170 receives the flux signal sensed in Sense First Magnetic Flux step 610. Control circuitry 170 generates a control signal configured to induce a second magnetic flux representing the DC and low-frequency subsonic components of the total magnetic flux within output transformer 130. The control circuitry may be adjusted so that the control signal is configured to maintain a non-zero quiescent magnetic bias level within output transformer 130. In this embodiment, the control signal is adjusted so that the second magnetic flux does not completely cancel or null out the DC and low-frequency subsonic components of the first magnetic flux, thus setting a non-zero quiescent magnetic bias level. This adjustment may use one or more preset configurations, and may produce desired audio effects as, for example, harmonically pleasing sounds. This embodiment may be used as a musical instrument amplifier, such as a guitar amplifier.

In other embodiments of Generate Control Signal step 620, control circuitry 170 may be adjusted to generate a control signal configured to induce a second magnetic flux that may substantially cancel or null out the DC and low-frequency subsonic components of the first magnetic flux, thus minimizing the magnetic saturation within the output transformer. This adjustment may use one or more preset configurations. This embodiment may be used as a high-fidelity amplifier system.

In Induce Second Magnetic Flux step 630, the control signal generated in Generate Control Signal step 620 is received by winding 180 in output transformer 130 via control signal coupling line 175. When winding 180 receives the control signal via control signal coupling 175, a second magnetic flux is induced within output transformer 130. This second magnetic flux may maintain a non-zero quiescent magnetic bias level within output transformer, or may substantially cancel or null the DC and low-frequency subsonic components of the first magnetic flux.

The above description is illustrative and not restrictive. Many variations of the invention will become apparent to those of skill in the art upon review of this disclosure. The scope of the invention should, therefore, be determined not with reference to the above description, but instead should be determined with reference to the appended claims along with their full scope of equivalents.

What is claimed is:

1. A system comprising:
    amplifier circuitry;
    an output transformer coupled to the amplifier circuitry;
    a magnetic sensor configured to sense a first magnetic flux of the output transformer and to generate a flux signal responsive to the first magnetic flux;
    control circuitry configured to receive the flux signal and to generate a control signal responsive to the flux signal; and
    a winding configured to receive the control signal and to induce a second magnetic flux within the output transformer responsive to the control signal, the second magnetic flux having opposite polarity to the first magnetic flux.

2. The system of claim 1 wherein the control circuitry is adjustable such that a quiescent magnetic bias level is maintained within the output transformer, the quiescent magnetic bias level producing desired audio effects.

3. The system of claim 1 wherein the control circuitry is adjustable such that a magnetic saturation within the output transformer is minimized.

4. The system of claim 1 wherein the control circuitry is adjustable to one or more preset configurations.

5. The system of claim 1 wherein the magnetic sensor comprises a Hall-Effect sensor.

6. The system of claim 1 wherein the magnetic sensor further comprises a magnetic flux concentrator.

7. The system of claim 1 wherein the magnetic sensor further comprises a bucking coil.

8. A method comprising:
    sensing a first magnetic flux of an output transformer;
    generating a control signal responsive to a flux signal using control circuitry; and
    inducing a second magnetic flux within the output transformer responsive to the control signal, the second magnetic flux having opposite polarity to the first magnetic flux.

9. The method of claim 8 wherein generating a control signal further comprises adjusting the control circuitry so that a quiescent magnetic bias level is maintained within the output transformer, the quiescent magnetic bias level producing desired audio effects.

10. The method of claim 8 wherein generating a control signal further comprises adjusting the control circuitry so that a magnetic saturation within the output transformer is minimized.

11. The method of claim 8 wherein generating a control signal further comprises adjusting the control circuitry to one or more preset configurations.

12. The method of claim 8 wherein the step of sensing a flux signal includes using a Hall-Effect sensor.

13. The method of claim 8 wherein the step of sensing a flux signal includes using a magnetic flux concentrator.

14. The method of claim 8 wherein the step of sensing a flux signal includes using a bucking coil.

15. An apparatus comprising:
    a magnetic sensor configured to sense a first magnetic flux of an output transformer and generate a flux signal;
    a flux signal line configured to receive the flux signal;
    control circuitry configured to receive the flux signal from the flux signal line and to generate a control signal; and
    a control signal line configured to receive the control signal and induce a second magnetic flux within the output transformer, the second magnetic flux having opposite polarity to the first magnetic flux.

16. The apparatus of claim 15 wherein the control circuitry is adjustable such that a quiescent magnetic bias level is maintained within the output transformer, the quiescent magnetic bias level producing desired audio effects.

17. The apparatus of claim 15 wherein the control circuitry is adjustable such that a magnetic saturation within the output transformer is minimized.

18. The apparatus of claim 15 wherein the control circuitry is adjustable to one or more preset configurations.

19. The apparatus of claim 15 wherein the magnetic sensor comprises a Hall-Effect sensor.

20. The apparatus of claim 15 wherein the magnetic sensor further comprises a magnetic flux concentrator.

21. The apparatus of claim 15 wherein the magnetic sensor further comprises a bucking coil.

* * * * *